United States Patent [19]
Knittel

[11] 4,177,424
[45] Dec. 4, 1979

[54] METHODS OF AND A CIRCUIT FOR MONITORING THE AMPLITUDE OF SINE WAVE-SHAPED SIGNALS

[75] Inventor: Siegfried Knittel, Naunheim, Fed. Rep. of Germany

[73] Assignee: Ernst Leitz Wetzlar GmbH, Wetzlar, Fed. Rep. of Germany

[21] Appl. No.: 801,909

[22] Filed: May 31, 1977

[30] Foreign Application Priority Data

Jun. 2, 1976 [DE] Fed. Rep. of Germany ....... 2624711

[51] Int. Cl.² .............. G01R 19/16; G01R 19/00; H03K 5/20
[52] U.S. Cl. ................. 324/102; 307/351; 324/103 P
[58] Field of Search ............ 324/102, 103 P; 307/351; 328/115, 116; 250/575; 356/207, 208, 226, 227; 340/662, 663

[56] References Cited

U.S. PATENT DOCUMENTS 3,963,983  6/1976  Hogg .................... 328/116

*Primary Examiner*—Rudolph V. Rolinec
*Assistant Examiner*—Ernest F. Karlsen
*Attorney, Agent, or Firm*—Schwartz, Jeffery, Schwaab, Mack, Blumenthal & Koch

[57] ABSTRACT

A method of and circuit for monitoring the amplitude of a sine wave-shaped electrical signal in a defined range of a signal period, wherein the signal is derived from scanning an object which is to be measured or controlled. A comparison circuit is provided which compares the signal being monitored to a reference signal and generates a first impulse signal which is applied to a logic gate. A second impulse signal generating network generates a second impulse signal determining the range of the signal period by adding at least one signal derived from additional signals contained in the signal spectrum to the signal being monitored. This impulse is also applied to the logic circuit. The logic circuit produces a switching signal for operating an indicator or control device.

7 Claims, 2 Drawing Figures

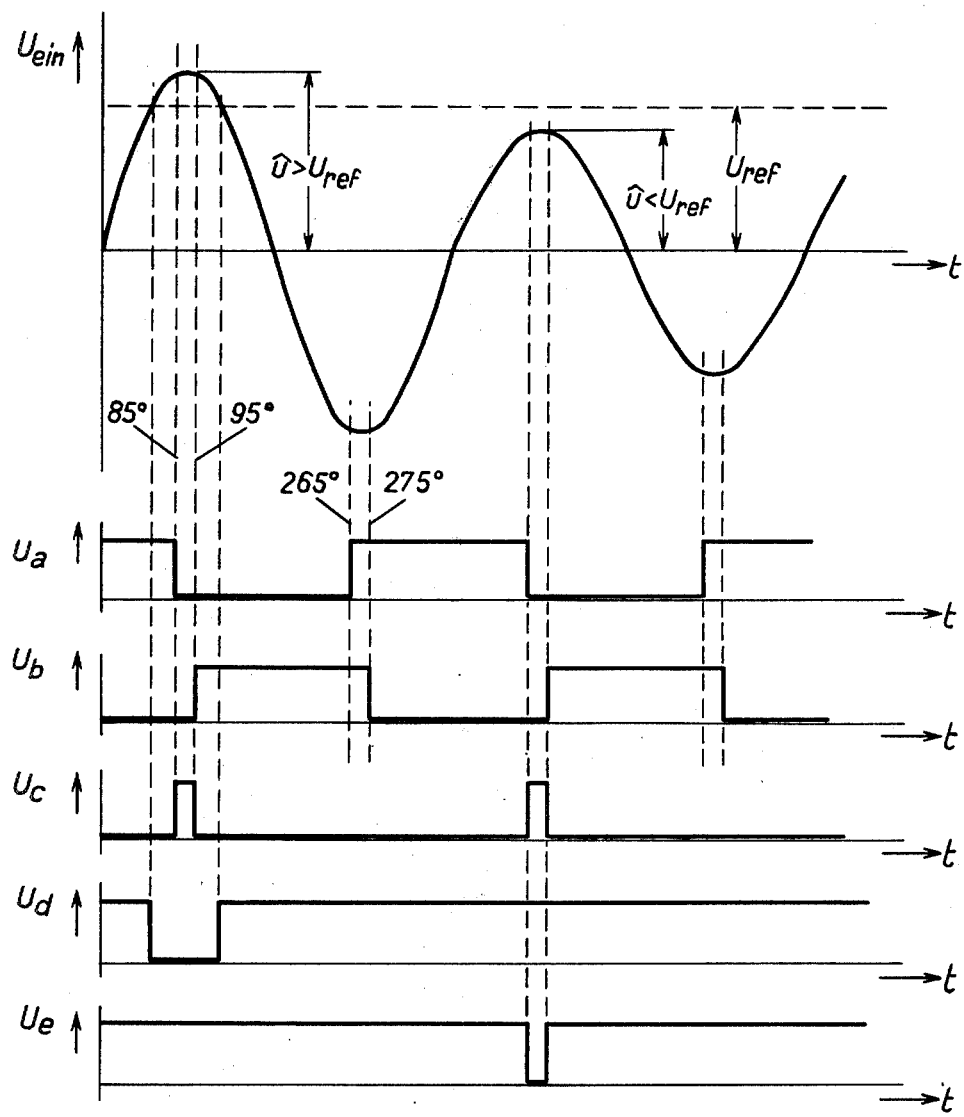

METHODS OF AND A CIRCUIT FOR MONITORING THE AMPLITUDE OF SINE WAVE-SHAPED SIGNALS

BACKGROUND OF THE INVENTION

This invention concerns a method and a circuit arrangement for monitoring the amplitude of sine-shaped signals, taken from a scan of an object which is to be measured or controlled. The signals are obtained both from static and from dynamic operation.

Signals of this type are used in counting and control circuits. It is therefore necessary that the amplitude of these signals be monitored within a level range, so that satisfactory functioning of such circuits is assured.

For example, an apparatus for contamination indication in a length measuring apparatus is known, where a special circuit monitors the amplitude of photo-receptor signals. Before the magnitude of the signal of the received signals drops due to contamination of the scale far enough that erroneous counting is possible, there is an optical indication, which shows that the rectified signal, obtained from scanning the scale and compared with a reference potential demonstrating the desired signal level, has dropped below it.

It is the disadvantage of this solution that signals (with f>0) are obtained only in dynamic operation. In static operation (stopped position), there is an erroneous indication.

SUMMARY OF THE INVENTION

It is therefore an object of this invention to provide a method and a circuit arrangement for implementation of the method which makes it possible to monitor the amplitude of a signal obtained by means of a photo receptor through object scanning in both dynamic and static operation.

In view of the foregoing object the instant invention contemplates a method of monitoring the amplitude of a sine wave-shaped electrical signal in a defined range of the signal, wherein the signal is derived from scanning an object which is to be measured or controlled. According to the method, the potential of the signal being monitored is compared with the potential of a reference signal to produce a first impulse signal. The signal being monitored is also added to at least one signal contained in the signal spectrum to produce a second impulse signal determining the range of the signal period. Both the first and second impulse signals are combined in a logic gate to produce a switching signal for measuring or controlling the object.

The method further contemplates adding at least two additional signals selected from the signal spectrum to the signal being monitored wherein the two additional signals added are shifted in phase relative to one another.

Furthermore, the instant invention contemplates a circuit for carrying out the afore-described method wherein the circuit includes a comparative means for comparing the signal being monitored to a reference signal to produce the first impulse signal when the potential of the signal being monitored exceeds the potential of the reference signal. The circuit also includes a second impulse signal generating network wherein the network includes means to add at least one signal derived from additional signals contained in the signal spectrum to the signal being monitored in order to produce a second impulse signal determining the range of the signal period being of interest for monitoring the amplitude. The first and second impulse signals are combined in a logic circuit to produce a switching signal that operates an indicator or control device.

Furthermore, the second impulse signal generator network includes means for adding at least two additional signals selected from the signal spectrum to the signal being monitored, wherein the two signals added are shifted in phase relative to one another.

Various other objects and advantages will appear from the following description of the preferred embodiment of the invention and the novel features will be particularly pointed out hereinafter in connection with the appended claims.

BRIEF DESCRIPTION OF THE DRAWINGS

FIG. 2 is a series of wave forms showing a signal being monitored and impulse diagrams relating to that signal.

DESCRIPTION OF THE PREFERRED EMBODIMENT

Figure 1:
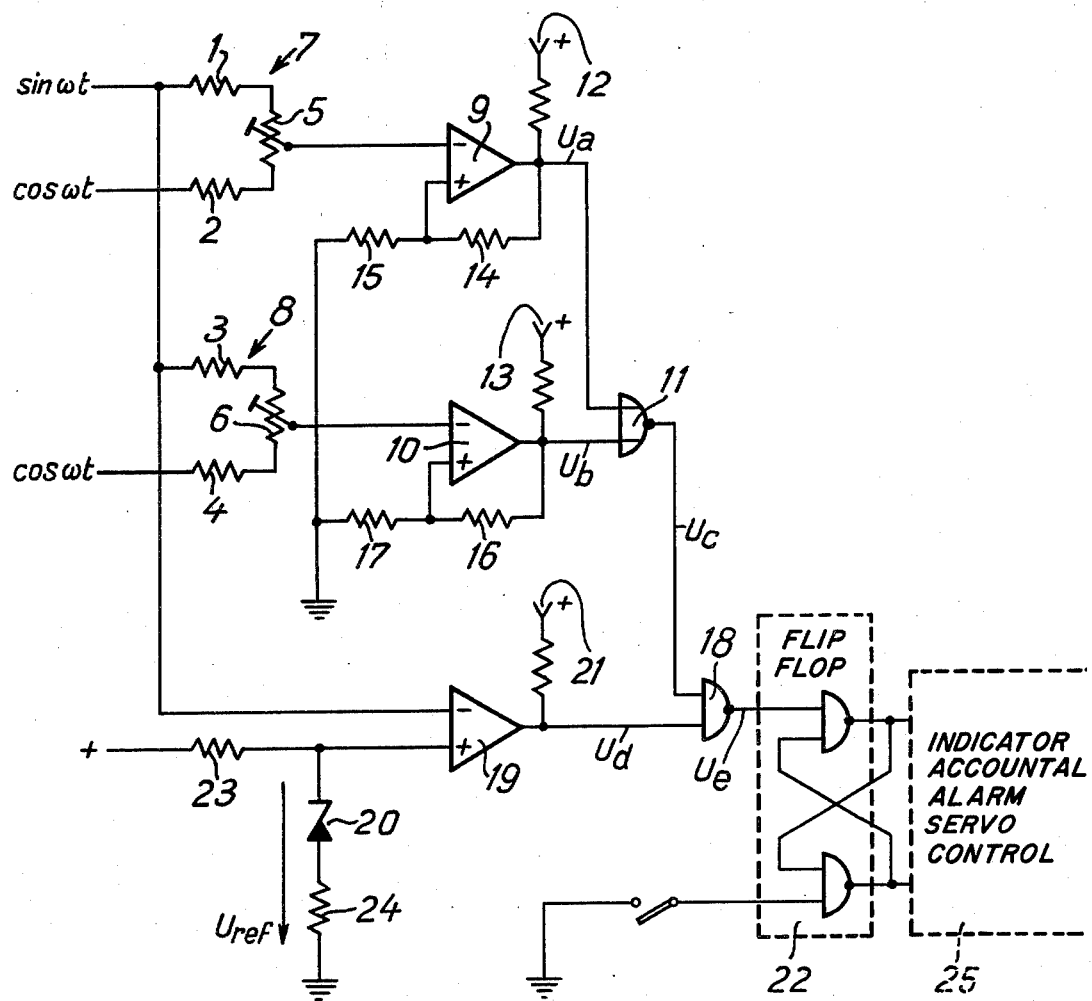
FIG. 1 is a circuit diagram in accordance with this invention, and p

In accordance with this invention, the problem of monitoring the amplitude of a signal obtained from a photo receptor upon scanning an obect in both dynamic and static operation is solved by the following method, wherein:

a. a first pulse or impulse signal is produced from a comparison between the potential of a signal which is to be monitored and a reference potential;

b. a second pulse or impulse signal, which determines the range or time interval of the signal period of interest for the amplitude monitoring, is derived from the signal which is to be monitored and at least one further signal contained in the signal spectrum or plurality of sine-wave shaped signals which is developed by the object scanning, and then c. the first and the second impulse signals are logically combined in a switching signal.

To solve this problem, it is further provided that the second impulse signal is derived from logic processing of signals which are generated through the specific addition of at least two additional signals to the signal which is to be monitored. The two additional signals are selected from the signal spectrum and are shifted in phase with respect to one another.

For the implementation of the method, the circuit arrangement of FIG. 1 is proposed, which circuit arrangement includes the following:

a. A comparison circuit, where the signal which is to be monitored is fed into a first input, and a reference potential is fed into a second input. The comparison circuit then produces a first impulse at its output when the signal potential exceeds the reference potential;

b. a network for impulse generation, which produces a second impulse from the signal which is to be monitored and from additional signals contained in the signal spectrum which is generated by the object scanning. The second impulse determines the range of the signal period which is of interest for the amplitude monitoring;

c. switching logic, to which the first and second impulse are fed, and which derives a switching signal from the combination of these impulses, wherein this signal is fed into a circuit which initiates an indicator or control device.

It is further provided that the reference potential, which is fed into the comparison circuit, is produced by a generator with the use, for example, of a Zener diode as limiter.

It is additionally proposed that the network, which produced the second impulse includes at least two voltage dividers as well as associated comparators in series connection with the voltage dividers. Furthermore, a logic circuit which combines the output signals of the comparator has an input from each comparitor. The voltage dividers each include a pair of summing resistors one of each pair receiving an out of phase additional signal derived from the signal spectrum. The voltage dividers each have a balancing resistance, which phase-shifts the summed signals with respect to each other and which are series connected with the summing resistances. The outputs of the balancing resistors are applied to the comparators.

The described circuit arrangement has the advantage that it makes it possible to recognize in time, both in dynamic and in static operation, the deterioration of the function of a measuring arrangement by external influences, such as, for example, by contamination of the entire optical installation or of the measurement embodiment (scale, reticle disc), by deterioration of light emission, and by misadjustment of the optical installation or measurement embodiment. With the proposed method, amplitudes of any size can be monitored at all frequencies where f>0 Hz, whereby at f=0 Hz an erroneous signal is not produced.

An additional advantage of the circuit arrangement lies in the fact that the amplitude range which is monitored can be changed through voltage dividers which are contained in the circuit arrangement. In addition, the reference potential is freely selectable and can be generated in any manner.

Referring now specifically to FIGS. 1 and 2, for the determination of the range of a signal spectrum, which is of interest for signal monitoring, two additional signals $-\cos \omega t$ and $\cos \omega t$ are selected from the signal spectrum, in addition to the input signal $\sin \omega t$.

Together with balancing resistances 5 and 6, each of the summing resistances 1 and 2, and 3 and 4, respectively, form first and second voltage dividers 7 and 8.

The input signal $\sin \omega t$ and the signal $-\cos \omega t$ are added in the voltage divider 7 and fed into the inverting input of a first comparator 9.

By means of the balancing resistance 5, the voltage divider 7 is adjusted so that the potential generated at the output of the comparison stage 9 jumps from 5 V to 0 V at $\phi=85°$ and from 0 V to 5 V at $\phi=265°$, whereby an impulse potential $U_a$ is periodically produced (FIG. 2).

The input signal $\sin \omega t$ and the signal $\cos \omega t$ are added in voltage divider 8 and fed into the inverting input of a second comparator 10.

By means of balancing resistance 6, the voltage divider 8 is adjusted in such a manner that the output potential of the comparator 10 jumps from 0 V to 5 V at $\phi=95°$ and from 5 V to 0 V at $\phi=275°$, whereby an impulse potential $U_b$ is periodically produced (FIG. 2).

The impulse potentials represented by signals $U_a$ and $U_b$ are fed into an intermediate logic circuit 11 which is in the form of a NOR gate. In this case, voltage sources 12 and 13, which are applied to the non-inverting inputs of comparators 9 and 10 through feedback resistances 14 and 15, and 16 and 17, assure that the output potentials of the first and second comparators are maintained at a compatibility (5 V) commensurate with the logic circuit 11, thus preventing damage to the logic circuit 11. The circuit elements connected to input through logic circuit 11 form a second impulse signal generating network.

When the impulse potentials $U_a$ and $U_b$ are combined within the logic circuit 11, an output impulse $U_c$ (FIG. 2) is generated, which is fed into a primary logic circuit 18 which is shown in the form of a NAND gate. The impulse $U_c$ provides a second impulse signal.

Simultaneously with the generation of the impulse $U_c$, the input signal $\sin \omega t$ is fed into a comparator 19, where it is compared with a reference potential $U_{ref}$. This reference potential $U_{ref}$ is generated by a (not illustrated) generator and fed into the non-inverting input of the comparator 19 through a voltage divider network 23, 24, which is equipped with a Zener diode 20.

In accordance with the comparison of its two input potentials, comparator 19 generates an impulse potential $U_d$ at its output, which is applied to a switching logic gate 18, along with impulse potential $U_c$ from logic circuit 11. The impulse potential $U_d$ provides a first impulse signal.

In addition, a voltage source 21 is applied to the output of comparator 19 to assure that the output potential of comparator 19 is maintained at a level of compatibility which is commensurate with the switching logic circuit 18.

If the potential of the sine-shaped input signal $\sin \omega t$ exceeds the reference potential $U_{ref}$ at the inverting input of the comparator 19, the potential at the output reverts from 5 V to 0V. An increase of the output potential to 5 V takes place at the moment the potential of the sine-shaped input signal $\sin \omega t$ drops below the reference potential $U_{ref}$ (FIG. 2).

If the input signal $\sin \omega t$ does not reach the magnitude of the reference potential $U_{ref}$, the output potential of comparator 19 remains constant at 5 V.

Through the combination of the impulses $U_c$ and $U_d$ in the logic of switching logic circuit 18, an output impulse potential $U_e$ (FIG. 2) is generated at the output of the switching logic circuit 18 having angular values between $\phi=85°$ and $\phi=95°$, when the potential of the input signal $\sin \omega t$ does not reach the reference potential $U_{ref}$.

The impulse $U_e$ switches a flip-flop circuit 22, which initiates an appropriate trouble signal which may, for example, extinguish an illuminated digital indicator, sound an acoustical alarm signal, or operate servo-control. The servo-control may, for example, correct or shut down the system being monitored.

The indicator, accountal alarm and servo control are schematically shown by the box 25.

In the application the following waveforms and elements are associated with the following identifying numerals and letters:

| | |
|---|---|
| first impulse signal | - $U_d$ |
| second impulse signal | - $U_c$ |
| primary logic circuit | - 18 |
| intermediate logic circuit | - 11 |
| second impulse signal generating network | - generally the network connected to intermediate logic circuit 11 |

The circuit described above is usable in measurement arrangements for monitoring the amplitude of sine-wave shaped electrical signals obtained by scanning an object in both static (no movement between object and measurement arrangement) and dynamic (movement between object and measurement arrangement) operation.

The circuit disclosed permits to recognize in due time a function deterioration of the measurement arrangement caused by external influences as for instance by contamination of the entire optical installation. Amplitudes of any size can be monitored at frequencies >0 Hz. No erroneous signal will be produced at a frequency f=0 Hz.

Prior art circuits only generate signals in dynamic operation and will cause erroneous indications at a static state. Yet the circuit described overcomes this disadvantage by generating an impulse $U_e$ while scanning the object during a static state of the measurement arrangement.

What is claimed is:

1. A method of monitoring the amplitude of one of a plurality of sine-wave shaped electrical signals in a predetermined time interval of the signal period wherein said plurality of sine-wave shaped signals is derived from scanning an object which is to be measured or controlled, said method comprising the steps of:
   (a) comparing the voltage of the signal being monitored with the voltage of a reference signal to produce a first pulse;
   (b) producing a second pulse determinative of said predetermined signal time interval by adding to said monitored signal at least one signal contained in said plurality of sine-wave shaped signals and phase shifted with respect to said monitored signal; and
   (c) combining said first and second pulses in logic means to produce a signal for operating output means in response to said monitored signal.

2. A circuit for monitoring the amplitude of one of a plurality of sine-wave shaped electrical signals in a predetermined time interval of the signal period wherein said plurality of sine-wave shaped signals are derived from scanning an object which is to be measured or controlled, said circuit comprising:
   comparator means for comparing the signal being monitored to a reference signal to produce a first pulse when the voltage of said monitored signals exceeds the voltage of said reference signal;
   means for producing a second pulse for determining the time interval of said signal period, including means for adding to said monitored signal at least one signal contained in said plurality of sine-wave shaped signals and phase shifted with respect to said monitored signal; and
   logic means for combining said first and second pulses for producing a signal for operating output means in response to said monitored signal.

3. The method of claim 1 wherein the second pulse is produced by adding to said monitored signal at least two additional signals selected from said plurality of sine-wave shaped signals and phase shifted with respect to said signal being monitored wherein the two additional signals added are shifted in phase relative to one another.

4. The circuit of claim 2 wherein said means for producing said second pulse includes means for adding to said monitored signal at least two additional signals selected from said plurality of sine-wave shaped signals and phase shifted with respect to said signal being monitored wherein the two added signals are shifted in phase relative to one another.

5. The circuit of claim 4 wherein said means for producing said second pulse further includes:
   first and second voltage dividers wherein the signal being monitored is applied to both voltage dividers and one of the additional signals is applied to each voltage divider, and
   first and second comparators connected to outputs from the first and second voltage dividers respectively, said comparators producing a pair of pulses which are subsequently applied to an intermediate logic circuit means having an output applied to said logic circuit means which in turn produces said output operating signal.

6. The circuit of claim 5 wherein the voltage dividers each include a pair of summing resistors through one of which in each pair the monitored signal is applied and through one of which in each pair one of the additional signals is applied and wherein each of said voltage dividers further includes a balancing resistance in series between the summing resistors, the output of each balancing resistance being applied to the associated comparator.

7. The circuit of claim 2, wherein the reference signal is produced by a generator means.

* * * * *